(12) United States Patent  (10) Patent No.: US 8,279,694 B2
Hong et al.  (45) Date of Patent: Oct. 2, 2012

(54) SEMICONDUCTOR MEMORY DEVICE HAVING A REDUCED NOISE INTERFERENCE

(75) Inventors: Duck Hwa Hong, Seoul (KR); Sang Il Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 276 days.

(21) Appl. No.: 12/826,918

(22) Filed: Jun. 30, 2010

(65) Prior Publication Data

US 2011/0158022 A1 Jun. 30, 2011

(30) Foreign Application Priority Data

Dec. 29, 2009 (KR) .......................... 10-2009-0133239

(51) Int. Cl.
 *G11C 16/04* (2006.01)
(52) U.S. Cl. ................ 365/205; 365/189.09; 365/194
(58) Field of Classification Search .............. 365/205, 365/206, 194, 189.09, 189.05, 226
See application file for complete search history.

(56) References Cited

U.S. PATENT DOCUMENTS 6,366,513 B1  4/2002 Wang
7,492,654 B2 *  2/2009 Won et al. ................. 365/205

FOREIGN PATENT DOCUMENTS

KR 1020060075610 A 7/2006
KR 100771545 B1 10/2007

* cited by examiner

*Primary Examiner* — David Lam
(74) *Attorney, Agent, or Firm* — Ladas & Parry LLP

(57) ABSTRACT

A semiconductor memory device having a reduced noise interference is presented. The semiconductor memory device includes a first switch and a second switch. The first switch is disposed in a sub hole region or an edge region and is configured to be turned on in response to a first pre-control signal, which is enabled before a time point at which a sense amplifier array begins to operate, and to apply an external voltage to a first voltage line through which a bias voltage is supplied to the sense amplifier array. The second switch is configured to be turned on in response to a first control signal, which is enabled in a sense amplifier overdriving period, and to apply the external voltage to the first voltage line.

19 Claims, 3 Drawing Sheets

SEMICONDUCTOR MEMORY DEVICE HAVING A REDUCED NOISE INTERFERENCE

CROSS-REFERENCES TO RELATED APPLICATIONS

The present application claims priority under 35 U.S.C 119(a) to Korean application number 10-2009-0133239, filed on Dec. 29, 2009, in the Korean intellectual property Office, which is incorporated herein by reference in its entirety set forth in full.

BACKGROUND

Exemplary embodiments of the present invention relate to a semiconductor memory device.

As the development of the technology for computer systems or electronic communications has steadily evolved, semiconductor memory devices used for storing information have become cheaper, physically smaller, and larger with respect to data capacity. As a result, increasing demands for efficient energy consumption are being imposed on these types of semiconductor memory devices in order to cut down unnecessary current dissipation.

A general cell array layout for storing data in dynamic random access memory (DRAM) semiconductor devices is usually configured to include a plurality of memory cells coupled to word and bit lines which usually form a web- or matrix-like structure. Each memory cell is usually composed of one transistor and one capacitor.

In a row decoding operation, a row address strobe (/RAS) signal, which is one of main signals for operating a DRAM semiconductor device, changes to an active state (low level), and a row address buffer receives row address signals. One word line of a cell array is then selected by decoding the received row address signals.

Data which are stored in memory cells coupled to the selected word line are loaded into a bit line pair (BL, /BL). A sense amplifier enable signal which informs a sense amplifier operation start time is enabled to operate a sense amplifier driving circuit of a cell block which is selected by the row addresses. The sense amplifier driving circuit changes a sense amplifier bias voltage to a core voltage (VCORE) and a ground voltage (VSS), and drives a sense amplifier latch. When the sense amplifier latch begins to operate, the bit line pair (BL, /BL) having maintained a slight potential difference changes to a large potential difference. A column decoder which is then selected by column addresses turns on column transfer transistors to transfer data of the bit line pair (BL, /BL) through data bus lines to the outside of the semiconductor memory device.

In these operations, the bit line pair (BL, /BL) is precharged to a bit line precharge voltage (VBLP) while in a standby mode before the semiconductor memory device begins to operate. When the semiconductor memory device begins to operate, the data of the memory cells are transferred and then change to different potentials having a slight potential difference. In such a state, when the sense amplifier latch begins to operate, the potentials of the bit line pair (BL, /BL) having maintained a slight potential difference change to a core voltage (VCORE) and a ground voltage (VSS), respectively. In this manner, the amplified data of the bit lines (BL, /BL) are transferred to data bus lines (DB, /DB) in response to a column decoder output signal (Yi). However, when the sense amplifier latch receives the core voltage (VCORE) as a sense amplifier bias voltage and begins to operate, a large amount of current is abruptly consumed. Consequently, the core voltage (VCORE) rapidly drops. In this case, when the sense amplifier latch begins to operate, an external voltage (VDD) is supplied as the core voltage (VCORE) by shorting the external voltage (VDD) and the core voltage (VCORE). This operation is called a sense amplifier overdriving.

Meanwhile, as illustrated in FIG. 1, a plurality of memory cell arrays and a plurality of sense amplifier arrays are disposed in the semiconductor memory device. Also, a plurality of sub word line drivers (SWD) are provided to selectively drive the memory cell arrays. In the semiconductor memory device layout illustrated in FIG. 1, regions between the sense amplifier arrays are called sub hole regions (SH), and both end regions are called edge regions.

SUMMARY

The present invention relates to a semiconductor memory device which is capable of substantially reducing noise interference.

The semiconductor memory device may include: a first switch disposed in a sub hole region or in an edge region and configured to be turned on in response to a first pre-control signal, which is enabled before a time point at which a sense amplifier array begins to operate, and to apply an external voltage to a first voltage line through which a bias voltage is supplied to the sense amplifier array; and a second switch configured to be turned on in response to a first control signal, which is enabled in a sense amplifier overdriving period, and to apply the external voltage to the first voltage line.

In another embodiment, a semiconductor memory device includes: first and second voltage lines through which a bias voltage is supplied to a sense amplifier array; a first switch unit configured to supply an external voltage or an internal voltage to the first voltage line in response to first and second control signals; a second switch unit configured to supply a ground voltage to the second voltage line in response to a third control signal; a first metal line coupled to the first voltage line; a second metal line coupled to the second voltage line; and a third switch unit configured to supply the external voltage to the first metal line in response to a first pre-control signal and supply the ground voltage to the second metal line in response to a second pre-control signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, specific embodiments of the present invention will be described with reference to the accompanying drawings. The drawings are not necessarily to scale and in some instances, proportions may have been exaggerated in order to clearly depict certain features of the invention.

Figure 1:
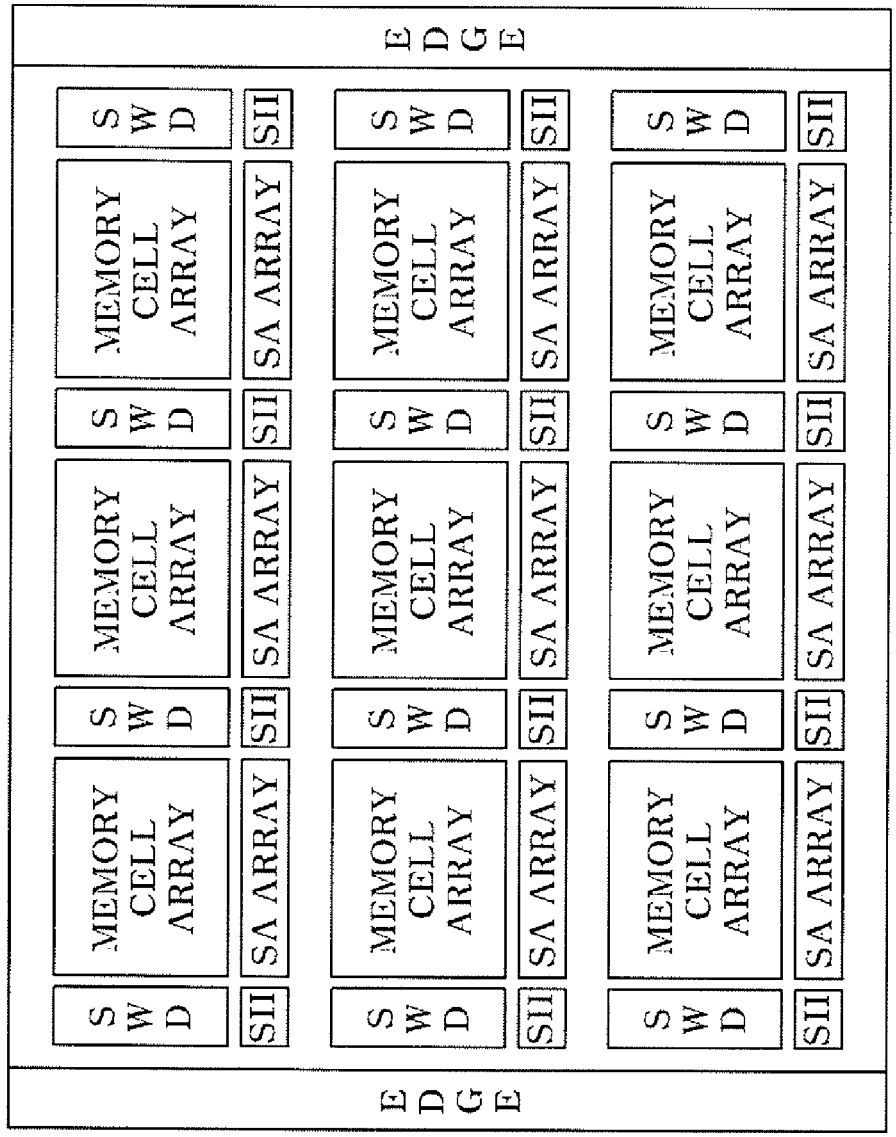
FIG. 1 is a layout diagram illustrating a general semiconductor memory device.
Figure 2:
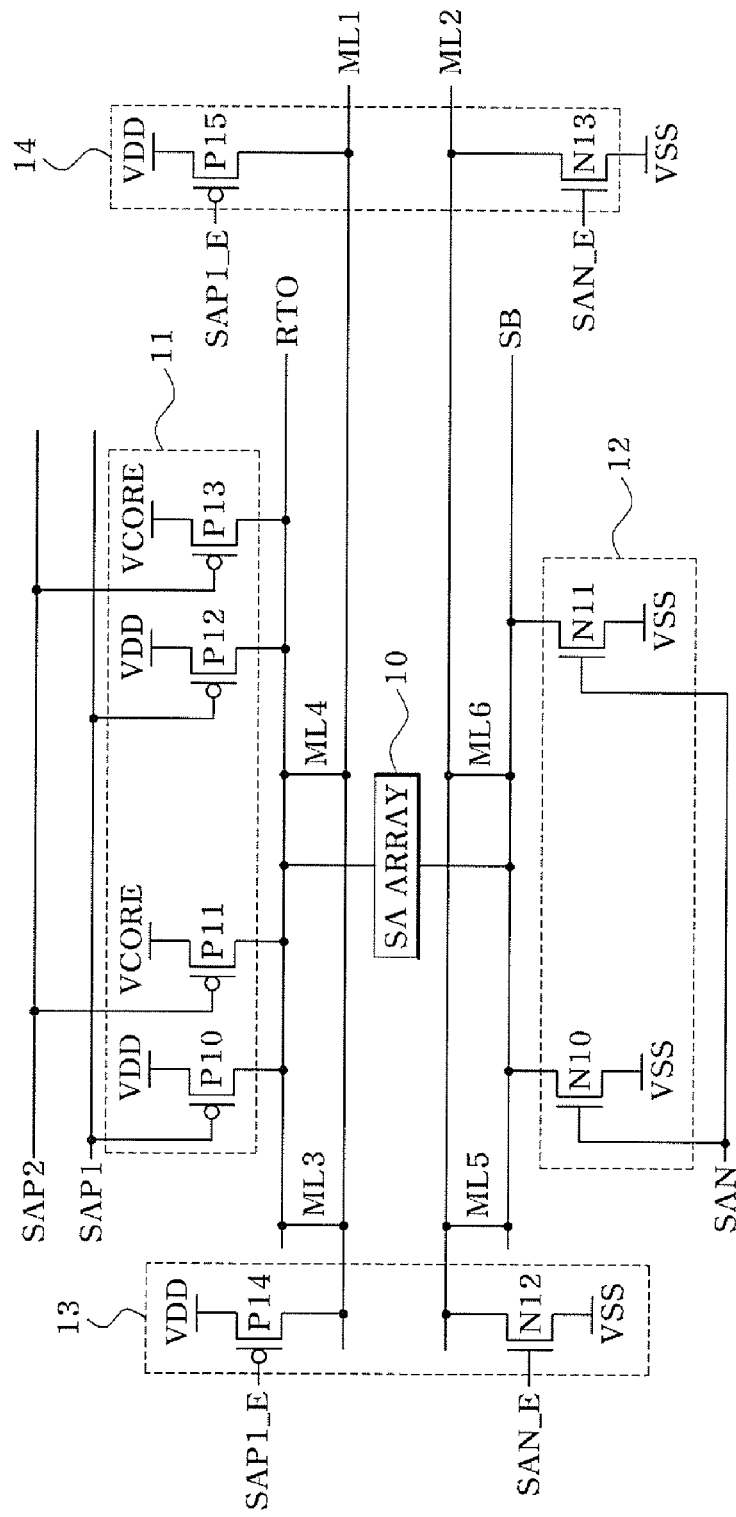
FIG. 2 is a circuit diagram illustrating the construction of a semiconductor memory device for the driving of a sense amplifier according to an embodiment of the present invention.

FIG. 2 is a circuit diagram illustrating the construction of a semiconductor memory device for the driving of a sense amplifier according to an embodiment of the present invention.

Referring to FIG. 2, a semiconductor memory device according to an embodiment of the present invention includes a sense amplifier array 10, a first switch unit 11, a second switch unit 12, a third switch unit 13, and a fourth switch unit 14.

The sense amplifier array 10 includes a plurality of sense amplifiers each of which is configured to sense a plurality of memory cells included in a memory cell array. The sense amplifier may be implemented with a cross-coupled latch which is coupled to a bit line pair.

The first switch unit 11 may include: a PMOS transistor P10 and a PMOS transistor P12, which are coupled between an external voltage VDD and a first voltage line RTO and configured to be turned on in response to a first control signal SAP1; and a PMOS transistor P11 and a PMOS transistor P13, which are coupled between an internal voltage VCORE and the first voltage line RTO and configured to be turned on in response to a second control signal SAP2. The first switch unit 11 may be disposed in a sub hole region (SH). The second control signal SAP2 is a signal which is enabled to a low level during a sense amplifier operation period after the end of a sense amplifier overdriving period.

The second switch unit 12 may include an NMOS transistor N10 and an NMOS transistor N11 which are coupled between a ground voltage VSS and a second voltage line SB and configured to be turned on in response to a third control signal SAN. The second switch unit 12 may be disposed in the sub hole region (SH).

The third switch unit 13 may include: a PMOS transistor P14, which is coupled between the external voltage VDD and a first metal line ML1 and configured to be turned on in response to a first pre-control signal SAP1_E; and an NMOS transistor N12, which is coupled between the ground voltage VSS and the second metal line ML2 and configured to be turned on in response to a second pre-control signal SAN_E. The first metal line ML1 is coupled to the first voltage line RTO through a third metal line ML3 and a fourth metal line ML4. The second metal line ML2 is coupled to a second voltage line SB through a fifth metal line ML5 and a sixth metal line ML6. In this manner, the PMOS transistor P14 is coupled to the first voltage line RTO through the first metal line ML1, and the NMOS transistor N12 is coupled to the second metal line SB through the second metal line ML2, because the indirect coupling to the first voltage line RTO and the second voltage line SB is further effective to remove noise. The third switch unit 13 may be disposed in the sub hole region or the edge region. In order to increase current drivability, the PMOS transistor P14 may be implemented with a MOS transistor having a larger size than the PMOS transistors P10 to P13 included in the first switch unit 11, and the NMOS transistor N12 may be implemented with a MOS transistor having a larger size than the NMOS transistors N10 and N11 included in the second switch unit 12.

The fourth switch unit 14 may include: a PMOS transistor P15, which is coupled between the external voltage VDD and the first metal line ML1 and configured to be turned on in response to the first pre-control signal SAP1_E; and an NMOS transistor N13, which is coupled between the ground voltage VSS and the second metal line ML2 and configured to be turned on in response to the second pre-control signal SAN_E. In order to increase current drivability, the PMOS transistor P15 may be implemented with a MOS transistor having a larger size than the PMOS transistors P10 to P13 included in the first switch unit 11, and the NMOS transistor N13 may be implemented with a MOS transistor having a larger size than the NMOS transistors N10 and N11 included in the second switch unit 12.

Figure 3:
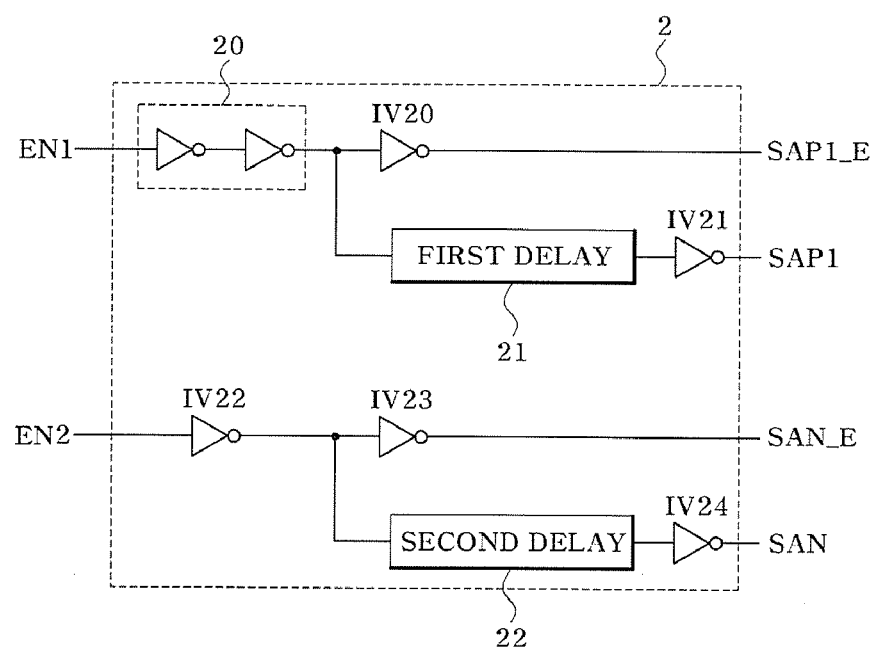
FIG. 3 is a circuit diagram illustrating a control signal generation unit for generating pre-control signals and first and third control signals which are inputted to the semiconductor memory device of FIG. 2.

FIG. 3 is a circuit diagram of a control signal generation unit 2 for generating the first pre-control signal SAP1_E, the first control signal SAP1, the second pre-control signal SAN_E, and the third control signal SAN. The control signal generation unit 2 is included in the semiconductor memory device of FIG. 2 and configured to drive the first switch unit 11, the second switch unit 12, the third switch unit 3, and the fourth switch unit 14.

More specifically, referring to FIG. 3, the control signal generation unit 2 includes a buffer 20, an inverter IV20, a first delay 21, and an inverter IV21. The buffer 20 is configured to buffer a first enable signal EN1, and the inverter IV20 is configured to operate as a buffer which inverts and buffers an output signal of the buffer 20 and generates the first pre-control signal SAP1_E. The first delay 21 is configured to delay the output signal of the buffer 20 by a predetermined time. The inverter IV21 is configured to invert and buffer an output signal of the first delay 21. The first enable signal EN1 is a signal which is enabled to a high level in response to a sense amplifier enable signal (not shown), and the first control signal SAP1 is a signal which is enabled to a low level during a sense amplifier overdriving period. The first pre-control signal SAP1_E is a signal which is enabled to a low level at a time point earlier than an enabling time point of the first control signal SAP1 by the delay time of the first delay 21.

In addition, the control signal generation unit 2 includes an inverter IV22, an inverter IV23, a second delay 22, and an inverter IV24. The inverter IV22 is configured to operate as a buffer which inverts and buffers a second enable signal EN2. The inverter IV23 is configured to operate as a buffer which inverts and buffers an output signal of the inverter IV22 and generates the second pre-control signal SAN_E. The second delay 22 is configured to delay the output signal of the inverter IV22 by a predetermined time. The inverter IV24 is configured to operate as a buffer which inverts and buffers an output signal of the second delay 22 and generates the third control signal SAN. The second enable signal EN2 is a signal which is enabled to a high level in response to a sense amplifier enable signal (not shown), and the third control signal SAN is a signal which is enabled to a high level during a sense amplifier operation period. The second pre-control signal SAN_E is a signal which is enabled to a high level at a time point earlier than an enabling time point of the third control signal SAN by the delay time of the second delay 22.

The operation of the semiconductor memory device configured as above will be described below.

When the sense amplifier enable signal (not shown) is enabled, the first enable signal EN1 and the second enable signal EN2 are enabled to a high level in assigned periods. The control signal generation unit 2 receives the first enable signal EN1 and the second enable signal EN2 and generates the first pre-control signal SAP1_E, the first control signal SAP1, the second pre-control signal SAN_E, and the third control signal SAN. The first pre-control signal SAP1_E is enabled to a low level before the start of the sense amplifier operation period, and the second pre-control signal SAN_E is enabled to a high level before the start of the sense amplifier operation period.

The PMOS transistor P14 of the third switch unit 13 and the PMOS transistor P15 of the fourth switch unit 14 are turned on in response to the first pre-control signal SAP1_E which is enabled to a low level. Thus, the first metal line ML1 is driven to the external voltage VDD. As such, by driving the first metal line ML1 to the external voltage VDD before the start of the sense amplifier operation period, it is possible to reduce noise components of the first voltage line RTO coupled through the third metal line ML3 and the fourth metal line ML4. The NMOS transistor N12 of the third switch unit 13 and the NMOS transistor N13 of the fourth switch unit 14 are turned on in response to the second pre-control signal SAN_E which is enabled to a high level. Thus, the second metal line ML2 is driven to the ground voltage VSS. As such, by driving the second metal line ML2 to the ground voltage VSS before the start of the sense amplifier operation period, it is possible to reduce noise components of the second voltage line SB coupled through the third metal line ML3 and the fourth metal line ML4.

Thereafter, when the first control signal SAP1 is enabled to a low level, the PMOS transistors P10 to P13 included in the first switch unit 11 are turned on and the first voltage line RTO is driven to the external voltage VDD. The first switch unit 11 drives the first voltage line RTO to the external voltage VDD during an overdriving period of the sense amplifier operation period. In addition, when the third control signal SAN is enabled to a high level, the NMOS transistors N10 and N11 included in the second switch unit 12 are turned on and the second voltage line SB is driven to the ground voltage VSS. The second switch unit 12 drives the second voltage line SB to the ground voltage VSS during the sense amplifier operation period. In this manner, when the sense amplifier operation period starts, the first voltage line RTO is driven to the external voltage VDD, and the second voltage line SB is driven to the ground voltage VSS. By previously driving the first voltage line RTO to the external voltage VDD and previously driving the second voltage line SB to the ground voltage before the start of the sense amplifier operation period, the sense amplifier can be driven in such a state that noise components of the first voltage line RTO and the second voltage line SB are substantially removed.

Meanwhile, when the overdriving period of the sense amplifier operation period is ended, the first control signal SAP1 is disabled to a high level, and the second control signal SAP2 is enabled to a low level. Thus, the first voltage line RTO is driven to the internal voltage VCORE. The time period in which the first voltage line RTO is driven to the internal voltage VCORE is called a normal operation period of the sense amplifier operation period.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A semiconductor memory device comprising:
a first switch disposed in a sub hole region or in an edge region such that the first switch is configured to be turned on in response to a first pre-control signal in which the first pre-control signal is enabled before a sense amplifier array begins to operate, and the first switch is configured to apply an external voltage to a first voltage line as a bias voltage supplied to the sense amplifier array; and
a second switch configured to be turned on in response to a first control signal such that the first control signal is enabled in a sense amplifier overdriving period and the second switch is configured to apply the external voltage to the first voltage line.

2. The semiconductor memory device of claim 1, wherein the first switch comprises a first MOS transistor coupled between a first metal line and the external voltage, the first metal line being coupled to the first voltage line wherein the first MOS transistor is configured to be turned on in response to the first pre-control signal.

3. The semiconductor memory device of claim 2, wherein the second switch comprises a second MOS transistor coupled between the first voltage line and the external voltage, wherein the second MOS transistor is configured to be turned on in response to the first control signal.

4. The semiconductor memory device of claim 3, wherein the first MOS transistor has a higher current drivability than the second MOS transistor.

5. The semiconductor memory device of claim 1, further comprising:
a third switch disposed in a sub hole region or in an edge region, the third switch configured to be turned on in response to a second pre-control signal, wherein the third switch is configured to be enabled before the sense amplifier array begins to operate, and the third switch is configured to apply a ground voltage to a second voltage line as the bias voltage supplied to the sense amplifier array; and
a fourth switch configured to be turned on in response to a second control signal in which the second control signal is enabled in a sense amplifier operation period, and the fourth switch is configured to apply the ground voltage to the second voltage line.

6. The semiconductor memory device of claim 5, wherein the third switch comprises a first MOS transistor coupled between a third metal line and the ground voltage, in which the third metal line is coupled to the second voltage line, and configured to be turned on in response to the second pre-control signal.

7. The semiconductor memory device of claim 6, wherein the fourth switch comprises a second MOS transistor coupled between the second voltage line and the ground voltage, and configured to be turned on in response to the second control signal.

8. The semiconductor memory device of claim 7, wherein the first MOS transistor has a higher current drivability than the second MOS transistor.

9. The semiconductor memory device of claim 1, further comprising:
a buffer unit configured to buffer a first enable signal;
a first buffer configured to buffer an output signal of the buffer unit and output the buffered signal as the first pre-control signal;
a first delay configured to delay the output signal of the buffer unit; and
a second buffer configured to buffer an output signal of the first delay and output the buffered signal as the first control signal.

10. The semiconductor memory device of claim 1, further comprising:
a second buffer configured to buffer a second enable signal;
a second buffer configured to buffer an output signal of the first buffer and output the buffered signal as the second pre-control signal;
a second delay configured to delay the output signal of the first buffer; and
a third buffer configured to buffer an output signal of the second delay and output the buffered signal as the second control signal.

11. A semiconductor memory device comprising:
- first and second voltage lines through which a bias voltage is supplied to a sense amplifier array;
- a first switch unit configured to supply an external voltage or an internal voltage to the first voltage line in response to first and second control signals;
- a second switch unit configured to supply a ground voltage to the second voltage line in response to a third control signal;
- a first metal line coupled to the first voltage line;
- a second metal line coupled to the second voltage line; and
- a third switch unit configured to supply the external voltage to the first metal line in response to a first pre-control signal and supply the ground voltage to the second metal line in response to a second pre-control signal.

12. The semiconductor memory device of claim 11, wherein the first switch unit and the second switch unit are disposed in a sub hole region.

13. The semiconductor memory device of claim 11, wherein the third switch unit is disposed in a sub hole region or an edge region.

14. The semiconductor memory device of claim 11, wherein the first switch unit comprises:
- a first MOS transistor coupled between the external voltage and the first voltage line and configured to be turned on in response to the first control signal; and
- a second MOS transistor coupled between the internal voltage and the first voltage line and configured to be turned on in response to the second control signal.

15. The semiconductor memory device of claim 14, wherein the second switch unit comprises a third MOS transistor coupled between the ground voltage and the second voltage line and configured to turned on in response to the third control signal.

16. The semiconductor memory device of claim 15, wherein the third switch unit comprises:
- a fourth MOS transistor coupled between the external voltage and the first metal line and configured to be turned on in response to the first pre-control signal; and
- a fifth MOS transistor coupled between the ground voltage and the second metal line and configured to be turned on in response to the second pre-control signal.

17. The semiconductor memory device of claim 16, wherein the fourth MOS transistor has a higher current drivability than the first MOS transistor, and the fifth MOS transistor has a higher current drivability than the third MOS transistor.

18. The semiconductor memory device of claim 11, further comprising a control signal generation unit configured to receive first a second enable signals and generate the first and second pre-control signals and the first and third control signals.

19. The semiconductor memory device of claim 18, wherein the control signal generation unit comprises:
- a first buffer unit configured to buffer the first enable signal;
- a first buffer configured to buffer an output signal of the first buffer unit and output the buffered signal as the first pre-control signal;
- a first delay unit configured to delay the output signal of the first buffer unit;
- a second buffer configured to buffer an output signal of the first delay unit and output the buffered signal as the first control signal;
- a third buffer configured to buffer the second enable signal;
- a fourth buffer configured to buffer an output signal of the third buffer and output the buffered signal as the second pre-control signal;
- a second delay unit configured to delay the output signal of the third buffer; and
- a fifth buffer configured to buffer an output signal of the second delay unit and output the buffered signal as the second control signal.

* * * * *